(12) United States Patent
Tachigori

(10) Patent No.: US 7,986,720 B2
(45) Date of Patent: Jul. 26, 2011

(54) CIRCUIT AND METHOD FOR DRIVING LIGHT-EMITTING ELEMENT AND OPTICAL TRANSMITTER

(75) Inventor: Masashi Tachigori, Tokyo (JP)

(73) Assignee: NEC Corporation, Tokyo (JP)

( * ) Notice: Subject to any disclaimer, the term of this patent is extended or adjusted under 35 U.S.C. 154(b) by 35 days.

(21) Appl. No.: 12/491,666

(22) Filed: Jun. 25, 2009

(65) Prior Publication Data

US 2009/0323744 A1 Dec. 31, 2009

(30) Foreign Application Priority Data

Jun. 27, 2008 (JP) ................................ 2008-168677

(51) Int. Cl.
*H01S 3/00* (2006.01)

(52) U.S. Cl. ................. 372/38.07; 372/38.1; 372/38.01; 372/29.011; 372/29.015

(58) Field of Classification Search .................. 372/38.1, 372/38.01, 38.02, 29.011, 29.015
See application file for complete search history.

(56) References Cited

U.S. PATENT DOCUMENTS

| | | | | |
|---|---|---|---|---|
| 4,535,458 A * | 8/1985 | Inoue et al. | ..................... | 372/25 |
| 5,748,657 A * | 5/1998 | Gaddis | ....................... | 372/38.02 |
| 6,157,661 A * | 12/2000 | Walker et al. | ............. | 372/38.02 |
| 6,242,870 B1 * | 6/2001 | Koyanagi et al. | ............. | 315/291 |
| 6,469,455 B1 * | 10/2002 | Inoue | ............................ | 315/291 |
| 6,622,549 B1 * | 9/2003 | Wlodarczyk et al. | ...... | 73/114.51 |
| 7,541,558 B2 * | 6/2009 | Smith et al. | .............. | 219/121.41 |
| 2003/0007525 A1 * | 1/2003 | Chen | ................................ | 372/31 |
| 2005/0264228 A1 * | 12/2005 | Kim | ........................... | 315/169.3 |
| 2008/0157682 A1 * | 7/2008 | Kwon | ........................... | 315/154 |
| 2008/0272708 A1 * | 11/2008 | Horiuchi et al. | .............. | 315/224 |
| 2009/0190621 A1 * | 7/2009 | Anderson et al. | .......... | 372/38.03 |
| 2010/0072915 A1 * | 3/2010 | Chu et al. | ....................... | 315/291 |
| 2010/0194301 A1 * | 8/2010 | Okubo | ......................... | 315/224 |
| 2011/0025234 A1 * | 2/2011 | Ohtaka et al. | ................. | 315/307 |
| 2011/0043139 A1 * | 2/2011 | Shiu et al. | ..................... | 315/307 |

FOREIGN PATENT DOCUMENTS

| JP | 2003008139 A | 1/2003 |
|---|---|---|
| JP | 2005057476 A | 3/2005 |
| JP | 2005116547 A | 4/2005 |

* cited by examiner

*Primary Examiner* — Minsun Harvey
*Assistant Examiner* — Delma R Forde

(57) ABSTRACT

A circuit for driving a light-emitting element such as a laser diode LD has a boost circuit for boosting an input voltage to supply it to the light-emitting element, a photoreceptor such as a photodiode PD for monitoring light from the light-emitting element; and a boost control circuit for controlling a boost voltage of the boost circuit based on a monitored amount of the photoreceptor. In the method for driving a light-emitting element by boosting an input voltage to supply the voltage to the light-emitting element, light from the light-emitting element is monitored and its monitored amount is used as a basis to control a boost voltage to the light-emitting element. A control circuit may be provided to control a driving current that passes through the light-emitting element based on the monitored amount of the photoreceptor.

9 Claims, 4 Drawing Sheets

CIRCUIT AND METHOD FOR DRIVING LIGHT-EMITTING ELEMENT AND OPTICAL TRANSMITTER

This application claims the benefit of priority based on Japanese Patent Application No. 2008-168677 filed on Jun. 27, 2008. The contents of Japanese Patent Application No. 2008-168677 is included in the contents the description of this application.

TECHNICAL FIELD

The present invention relates to a circuit and a method for driving a light-emitting element and an optical transmitter. Particularly, the present invention relates to a circuit and a method for boosting an input voltage and supplying a boost voltage to the light-emitting element, and an optical transmitter including the circuit.

BACKGROUND ART

Description is made, with reference to FIG. 1, about a structural example of a laser diode driving circuit (LD driving circuit) which uses a boost circuit to act as a supply source of a driving current of a laser diode (LD).

The LD driving circuit shown in FIG. 1 has a boost circuit 11 and an optical output automatic power control circuit (APC circuit) 12.

A supply voltage Vcc is boosted by the boost circuit 11 and applied to the collector of a transistor Tr1 connected to the laser diode LD. In the APC circuit 12, an optical output from the laser diode LD is photoelectrically converted by a photodiode PD, and a monitoring current passing through a resister R3 is input to an inverting amplifier circuit as a monitoring voltage. Then, an output from the inverting amplifier circuit is input to the base of a transistor Tr3. The collector of the transistor Tr3 is connected to the transistors Tr1 and Tr2 that make up a current mirror circuit, and a driving current corresponding to a base potential of the transistor Tr3 passes through the laser diode LD. When the amount of luminescence of the laser diode LD is reduced due to fluctuations in temperature or the like, the monitoring current of the photodiode PD is reduced. Then, the output from the inverting amplifier circuit is increased and the base potential of the transistor Tr3 is increased, and thereby the driving current of the laser diode LD is increased. Reversely, when the amount of luminescence of the laser diode LD is increased, the APC circuit 12 operates to reduce the driving current of the laser diode LD. Thus, the optical output from the laser diode LD is controlled automatically.

A related-art example of the LD driving circuit is described in the patent literature 1. The LD driving circuit of the patent literature 1 detects an optical output of a semiconductor laser by a photodiode and generates a laser driving current based on a monitoring voltage of the photodiode. A transmitter including a boost circuit is described in the patent literature 2. The boost circuit applies a boost voltage to a light-emission driving part including an infrared-emitting diode. Additionally, the patent literature 3 discloses that a photodiode detects a partial optical output from a semiconductor laser diode and a laser driving circuit controls a driving current of the semiconductor laser diode based on its detection results.

CITATION LIST

Patent Literature

{PTL 1} Japanese Patent Application Laid-open No. 2003-008139 (FIG. 1, Paragraph {0012}, etc.)
{PTL 2} Japanese Patent Application Laid-open No. 2005-057476 (FIG. 1, etc.)
{PTL 3} Japanese Patent Application Laid-open No. 2005-116547 (FIG. 2, Paragraph {0002}, etc.)

SUMMARY OF INVENTION

Technical Problem

In the boost circuit shown in FIG. 1, the voltage is preset to be higher in consideration of deterioration compensating current of the laser diode LD. Generally, as the boost circuit boosts an input voltage more, the conversion efficiency of the boost circuit becomes worse, and the power consumption is increased.

In addition, as the LD driving circuit needs large current of 100 mA or more, its parts may have to be selected in consideration of ratings and power consumption of the transistor Tr1 itself for a certain boost voltage. This restriction causes a problem of reduction in compensation.

The present invention has an exemplary object to prevent increase in power consumption and to extend the range of choices in designing transistors for supplying a driving current.

Solution to Problem

A first exemplary aspect in accordance with the present invention provides a circuit for driving a light-emitting element, including:
a boost circuit for boosting an input voltage and supplying a boost voltage to the light-emitting element;
a photoreceptor for monitoring light from the light-emitting element; and
a boost control circuit for controlling the boost voltage based on a monitored amount of the photoreceptor.

A second exemplary aspect in accordance with the present invention provides a method for driving a light-emitting element, including:
boosting an input voltage and supplying a boost voltage to the light-emitting element; and
monitoring light from the light-emitting element and controlling the boost voltage to the light-emitting element based on a monitored amount of the monitoring light.

DESCRIPTION OF EMBODIMENTS

With reference to the drawings, exemplary embodiments of the present invention will be described in detail below.

Figure 1:
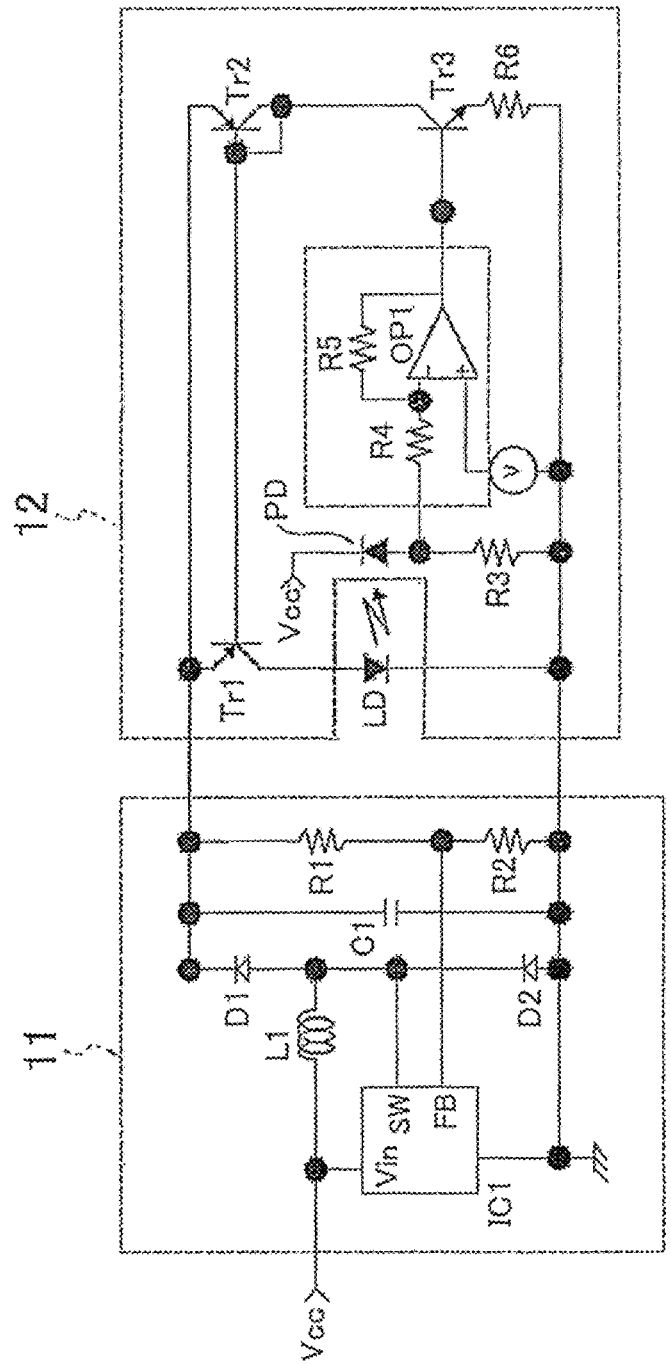
FIG. 1 A circuitry view shows a structural example of the Laser Diode driving circuit (LD driving circuit)
Figure 2:
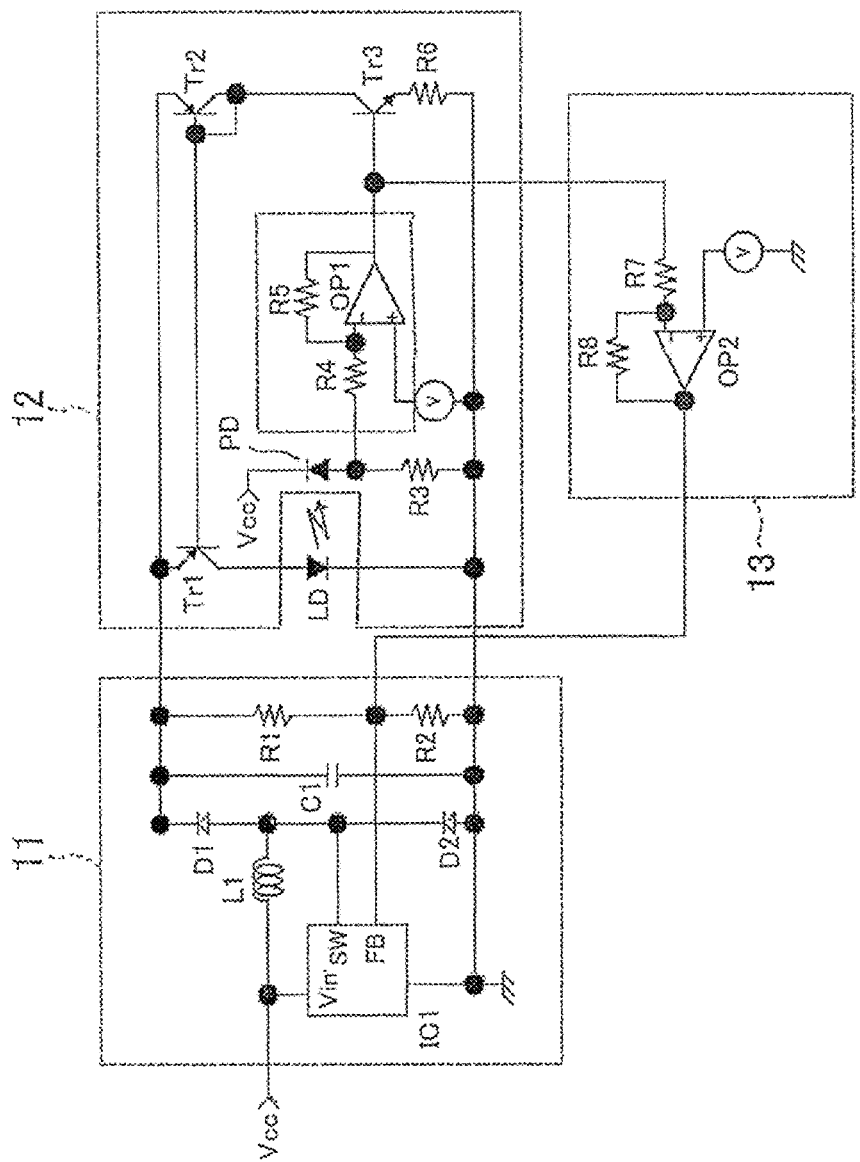
FIG. 2 A circuitry view shows an LD driving circuit according to an exemplary embodiment of the invention.

FIG. 2 is a circuitry view of a laser diode (LD) driving circuit according to an exemplary embodiment of the present invention. As shown in FIG. 2, the LD driving circuit has a boost circuit 11, an optical output automatic power control circuit (APC circuit) 12, which is a control circuit, and a boost control circuit 13.

Figure 4:
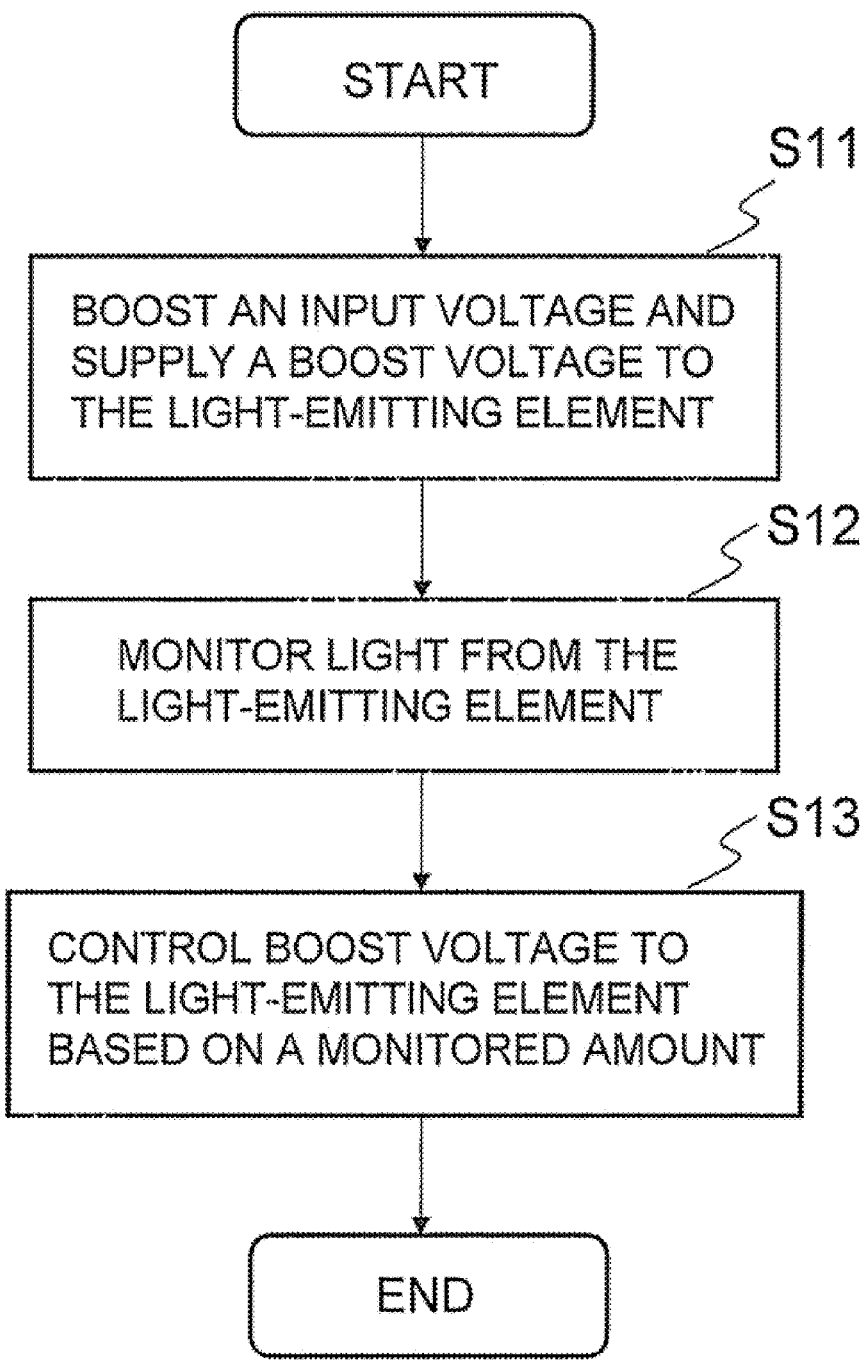
FIG. 4 A flow chart shows operation of the LD driving circuit according to the exemplary embodiment of the invention transmitter.

FIG. 4 is a flow chart that shows operation of the LD driving circuit according to the exemplary embodiment of the invention transmitter.

As shown in FIG. 2, the boost circuit 11 is a circuit including a switching regulator. An SW terminal of the regulator IC is connected to an anode of a diode D1, a cathode of a diode D2 and one terminal of the coil L1. The other terminal of the coil L1 is connected to an input terminal Vin of the regulator IC1. A supply voltage Vcc is applied to the input terminal Vin. A capacitor C1 is connected in parallel with the cathode of the diode D1 and the anode of the diode D2. Resistances R1 and R2 connected in series are connected in parallel with the cathode of the diode D1 and the anode of the diode D2. The point between the resistances R1 and R2 is connected to an FB terminal of the regulator IC1.

A voltage output from the SW terminal of the regulator IC1 is output from the cathode side of the diode D1 as a smoothed boost voltage. The boost voltage is divided by the resistances R1 and R2, and is input to the FB terminal. The input voltage to the FB terminal is used as a basis to set the output voltage of the SW terminal. When the voltage of the FB terminal is lowered, the output voltage from the SW terminal becomes higher. On the other hand, when the voltage of the FB terminal is increased, the output voltage from the SW terminal is lowered. The boost voltage is supplied as a power supply voltage of the transistor Tr1 that supplies a current to the laser diode LD.

The supply voltage Vcc is boosted by the boost circuit 11 and is applied to the collector of the transistor Tr1 connected to the laser diode LD that constitutes a light-emitting element (step S11 of FIG. 4). In the APC circuit 12, an optical output from the laser diode LD is photoelectrically converted by the photodiode PD that is a photoreceptor, and a monitoring current to pass through the photodiode PD is converted into a monitoring voltage by the resistance R3 to be input via a resistance R4 to an inverting input terminal (−) of an operational amplifier OP1 that constitutes an inverting amplifier circuit (step S12 of FIG. 4). The inverting input terminal is connected with an output terminal of the operational amplifier OP1 through a resistance R5. The monitoring voltage is inverting-amplified in accordance with the APC set voltage applied to the non-inverting input terminal of the operational amplifier OP1 and the voltage is output into the base (control electrode) of the transistor Tr3. The transistors Tr1 and Tr2 form a current mirror circuit and the collector (one main electrode) of the transistor Tr3 is connected to the emitter (the other main electrode) of the transistor Tr2. The driving current passing through the laser diode LD becomes a current corresponds to the base electric potential (electric potential of the control electrode) of the transistor Tr3. When the amount of luminescence of the laser diode LD is reduced due to fluctuations in temperature or the like, the monitoring current (monitor amount) of the photodiode PD is reduced. Then, the output from the inverting amplifier circuit is increased, and the base potential of the transistor Tr3 is increased, and finally, the driving current of the laser diode LD is increased. On the other hand, when the amount of luminescence of the laser diode LD is increased, the APC circuit 12 behaves to reduce the driving current of the laser diode LD. In this way, the optical output from the laser diode LD is controlled automatically.

The boost control circuit 13 inverting-amplifies the output from the inverting amplifier circuit of the APC circuit 12 and returns it to the FB terminal of the boost circuit 11 (step S13 of FIG. 4). An output of the operational amplifier OP1 of the APC circuit 12 is input via a resistance R7 into an inverting input terminal (−) of the operational amplifier OP2. The inverting input terminal is connected with an output terminal of the operational amplifier OP2 through a resistance R8. When the amount of luminescence of the laser diode LD is reduced and the output from the inverting amplifier circuit of the APC circuit 12 is increased, the boost control circuit 13 operates to lower the voltage of the FB terminal so as to increase the current of the laser diode LD. On the other hand, when the amount of luminescence of the laser diode LD is increased and the output from the inverting amplifier circuit of the APC circuit 12 is lowered, the boost control circuit 13 operates to increase the voltage of the FB terminal so as to reduce the current of the laser diode LD. The HVset voltage to be applied to the non-inverting input terminal of the operational amplifier OP2 of the boost control circuit 13 is set to an initial voltage of the FB terminal.

According to this embodiment, operation is performed to achieve such a boost voltage as to keep a minimal voltage Vce of the transistor Tr1 for passage of required current through the laser diode LD and a drop in voltage of the laser diode LD corresponding to the current required for the laser diode LD. This contributes to reduction of power consumption of whole of the circuit as compared with the case of using of a fixed boost voltage. Besides, it becomes possible to reduce power consumption of the transistor Tr1 itself that needs to be driven with large current and extend the range of choices in designing of the transistor Tr1.

Further, according to this embodiment, the boost circuit operates to achieve such a boost voltage as to keep a minimal voltage Vce ("Vce" means voltage between the collector and emitter) of the transistor Tr1 for passage of required current through the laser diode and a drop in voltage of the laser diode in agreement with the current required for the laser diode. Hence, as the Vce voltage of the transistor Tr1 can be minimized, it becomes possible to increase the upper limit of current compensation set by the ratings and power consumption of the transistor Tr1 itself.

Here, in this embodiment, the optical output automatic power control circuit (APC circuit) may not be used. In such a case, the boost voltage of the boost circuit can be controlled by inputting a monitoring voltage, which is detected by the resistance R3 and the photodiode PD, into the FB terminal via the amplifier circuit that constitutes boost control circuit.

Figure 3:
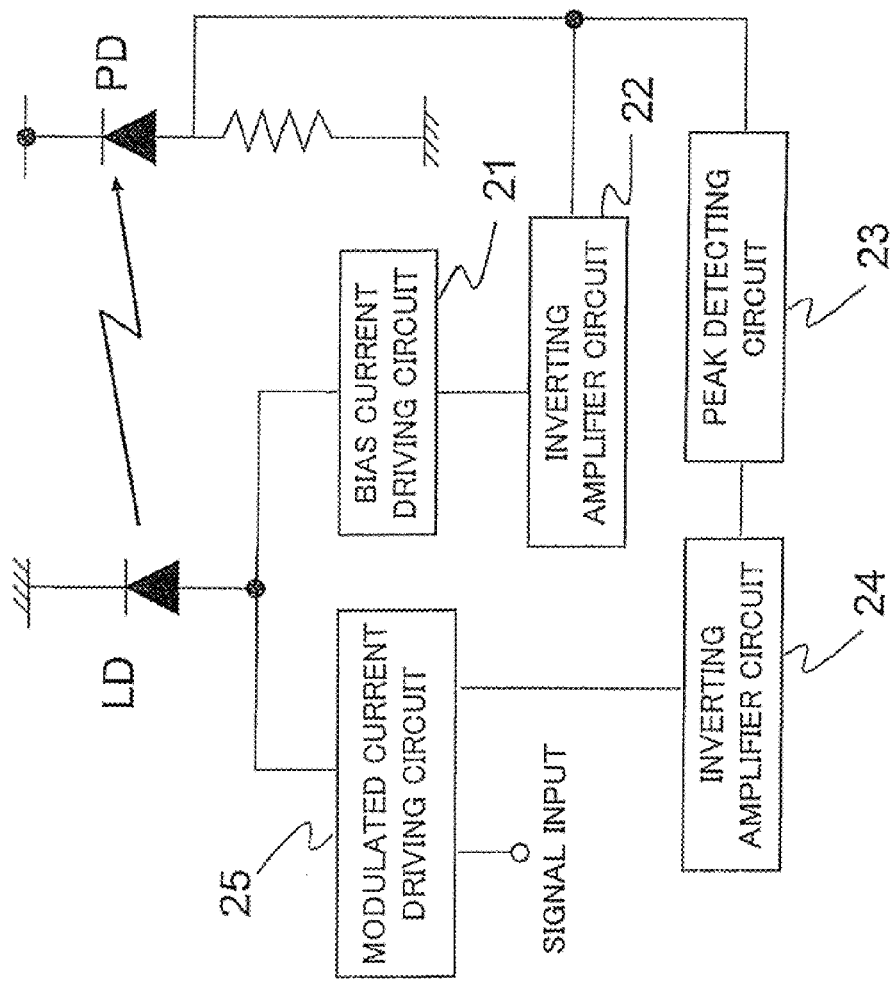
FIG. 3 A block diagram shows a transmitter according to the exemplary embodiment of the present invention.

FIG. 3 is a block diagram of a transmitter using an LD driving circuit according to the present exemplary embodiment. The structure of the transmitter is shown in the Japanese Patent Application Laid-open No. 2005-57216.

As shown in FIG. 3, a driving current controlled by a bias current driving circuit 21 and a modulated current driving circuit 25 passes through the laser diode LD. An optical output from the laser diode LD is monitored by the photodiode PD, its monitoring voltage is input to an inverting amplifier circuit 22 and its output is input to the bias current driving circuit 21. The photodiode PD, the inverting amplifier circuit 22 and the bias current driving circuit 21 correspond to the LD driving circuit of this embodiment, and the bias current driving circuit includes the boost circuit, the boost control circuit and the APC circuit (excluding the photodiode PD, the resistance R3 and the inverting amplifier circuit). Besides, the monitoring voltage is input via a peak detecting circuit 23 into the inverting amplifier circuit 24, and the inverting amplifier circuit 24 gives an output to the modulated current driving circuit 25. The modulated current is also controlled based on the monitoring voltage. The modulated current driving circuit 25 receives a transmission signal voltage.

The exemplary embodiments exert the following exemplary effects.

A first exemplary effect is such that as the boost circuit operates to boost a voltage as required to make a necessary current pass through the light-emitting element, the boosting operation is minimal, and increase in power consumption of the boost circuit can be prevented.

A second exemplary effect is such that as the boost circuit operates to boost a voltage as required to make a necessary current pass through the light-emitting element, the voltage between main electrodes of the transistor for supplying a driving current to the light-emitting element can be minimized. This makes it possible to increase the upper limit of current compensation set by the ratings and power consumption of the transistor itself.

The application of the circuit for driving a light-emitting element of the present invention is not limited to the transmitter but may be an optical pickup of an optical disk device, for example.

Although representative exemplary embodiments of the present invention have been described above, the present invention can be performed in other various forms without departing from the spirit or main features defined by the claims of this application. Therefore, each exemplary embodiment described above is only an example, and should not be interpreted to a limited extent. The scope of the present invention is shown by the claims and not restricted by the description in DESCRIPTION and ABSTRACT. In addition, modifications and variations belonging to an equivalent scope of the claims are within the scope of the present invention.

The invention claimed is:

1. A circuit for driving a light-emitting element, comprising:
   a boost circuit for boosting an input voltage and supplying a boost voltage to the light-emitting element, where the boost circuit comprises:
      a regulator including an input terminal to which the input voltage is supplied, a first output terminal, and a second output terminal, where a voltage from the first output terminal is applied through a diode to the light emitting element as the boost voltage; and,
      a first reactance and a second reactance connected together in series between a cathode side of the diode and a ground, the second output terminal connected to a connection point between the first reactance and the second reactance;
   a photoreceptor for monitoring light from the light-emitting element; and
   a boost control circuit for controlling the boost voltage based on a monitored amount of the photoreceptor, where an output of the boost control circuit is divided by the first reactance and the second reactance and supplied to the second output terminal,
   wherein the voltage from the first output terminal is controlled based on a voltage supplied to the second output terminal.

2. The circuit of claim 1, further comprising a control circuit for controlling a driving current based on the monitored amount of the photoreceptor, the driving current passing through the light-emitting element.

3. The circuit of claim 1, wherein the light-emitting element is a laser diode.

4. A method for driving a light-emitting element, comprising:
   boosting an input voltage and supplying a boost voltage to the light-emitting element by a boost circuit comprising:
      a regulator including an input terminal to which the input voltage is supplied, a first output terminal, and a second output terminal, where a voltage from the first output terminal is applied through a diode to the light emitting element as the boost voltage; and,
      a first reactance and a second reactance connected together in series between a cathode side of the diode and a ground, the second output terminal connected to a connection point between the first reactance and the second reactance; and
   monitoring light from the light-emitting element;
   controlling the boost voltage to the light-emitting element based on a monitored amount of the monitoring light;
   dividing an output resulting from controlling the boost voltage by the first reactance and the second reactance; and,
   supplying the output to the second output voltage,
   wherein the voltage from the first output terminal is controlled based on a voltage supplied to the second output terminal.

5. The method of claim 4, wherein the monitored amount is used to control a driving current that passes through the light-emitting element.

6. The method of claim 4, wherein the light-emitting element is a laser diode.

7. An optical transmitter comprising:
   the circuit of claim 1; and
   a light-emitting element emitting light by the circuit.

8. The circuit of claim 1, wherein
   the voltage from the first output terminal is increased when the voltage supplied to the second output terminal is decreased, and
   the voltage from the first output terminal is controlled based on the voltage supplied to the second output terminal.

9. The method of claim 4, wherein
   the voltage from the first output terminal is increased when the voltage supplied to the second output terminal is decreased, and
   the voltage from the first output terminal is controlled based on the voltage supplied to the second output terminal.

* * * * *